US008611558B2

(12) United States Patent
Smaragdis

(10) Patent No.: US 8,611,558 B2
(45) Date of Patent: Dec. 17, 2013

(54) SYSTEM AND METHOD FOR DYNAMIC RANGE EXTENSION USING INTERLEAVED GAINS

(75) Inventor: Paris Smaragdis, Brookline, MA (US)

(73) Assignee: Adobe Systems Incorporated, San Jose, CA (US)

(*) Notice: Subject to any disclaimer, the term of this patent is extended or adjusted under 35 U.S.C. 154(b) by 1097 days.

(21) Appl. No.: 12/393,856

(22) Filed: Feb. 26, 2009

(65) Prior Publication Data

US 2013/0129115 A1    May 23, 2013

(51) Int. Cl.
 *H03G 3/00* (2006.01)
(52) U.S. Cl.
 USPC ................................ 381/107; 381/66
(58) Field of Classification Search
 USPC ............................................................ 381/66
 See application file for complete search history.

(56) References Cited

U.S. PATENT DOCUMENTS

| 3,699,325 | A | * | 10/1972 | Montgomery et al. | 341/139 |
| 5,754,973 | A | * | 5/1998 | Akune | 704/205 |
| 2006/0193671 | A1 | | 8/2006 | Yoshizawa et al. | |
| 2006/0256978 | A1 | * | 11/2006 | Balan et al. | 381/94.7 |
| 2007/0016417 | A1 | * | 1/2007 | Sung et al. | 704/230 |

OTHER PUBLICATIONS

S. J. Godsil and P. J. W. Rayner, "Digital Audio Restoration—A Statistical Model Based Approach," Springer-Verlag, London Limited, 1998.
S. K. Nayar and T. Mitsunaga, "High Dynamic Range Imaging: Spatially Varying Pixel Exposures," in Proc. IEEE Conference on Computer Vision and Pattern Recognition, Jun. 2000, vol. 1, pp. 472-479.

* cited by examiner

*Primary Examiner* — David Vu
*Assistant Examiner* — Jonathan Han
(74) *Attorney, Agent, or Firm* — Wolfe-SBMC

(57) ABSTRACT

A method and system is presented for sampling analog signals in a manner that avoids the effects of signal clipping due to a limited dynamic range. A method and device for sampling an analog input using multiple gains, or gain mask, is described. By using different gains during different time quanta, a subset of the sampled points may effectively be attenuated before being sampled and converted to a digital representation. If clipping occurs during the sampling process, the true values of the clipped samples may be interpolated using the amplitudes of the non-clipped samples, which may not have been attenuated. Such interpolation may include constructing and/or solving a constraint optimization problem using linear programming. In one embodiment, such a problem may be constructed and/or solved by using sign information from the clipped samples and/or by imposing a sparsity assumption on the signals during the reconstruction process.

30 Claims, 5 Drawing Sheets

SYSTEM AND METHOD FOR DYNAMIC RANGE EXTENSION USING INTERLEAVED GAINS

BACKGROUND

Description of Related Art

Signal clipping is a well-known problem in sampling theory and one encountered frequently with everyday use of devices such as audio recorders or digital cameras. Clipping is the effect of attempting to sample a signal whose values exceed the limits of the numerical representation in use, thereby losing information and obtaining a distorted sampled representation.

Traditionally, this problem has been addressed by careful calibration of the sampling machinery in relation to the expected input, so that the likelihood of clipping is minimized. However this is a tedious and often unreliable process, which is rarely performed by non-specialists. In order to alleviate this problem, various automatic approaches have been devised. The most straightforward is that of manipulating the gain of the analog input signal before sampling. There is extensive work on signal processors that modulate incoming signals in such a manner so that their values are constrained within a specific dynamic range. These are known as compressors (or limiters) and have found extensive use in the audio production industry. In the speech community, such approaches are also known as automatic gain control (ACG) methods.

Once past the digitization process, clipping can also be treated as a missing data problem where the clipped data are inferred using an appropriate signal model. There has been a significant amount of work on estimating missing data in this manner. However, these approaches are mostly concerned with obtaining a plausible reconstruction given a learned model. Because of that, they do not present a sampling methodology that should be employed for arbitrary signals but are rather specialized solutions that require an appropriate signal model.

Recently some approaches have been advanced in image capture technology that address this issue in the context of digital photography. These approaches make use of modulation masks when sampling a signal and use that knowledge to reconstruct data that spans a larger range of values. Although the aforementioned approaches work well for imaging, they result in very noticeable aliasing effects when used on audio data.

SUMMARY

In order to reduce the effects of signal clipping due to the limited dynamic range of a digital sampling representation, an analog signal capture device may sample an analog input (such as an audio signal) using a gain mask. A gain mask may comprise multiple gain values by which the capture device may amplify or attenuate the signal at any given time quantum. In various embodiments, the gain mask may be predetermined or may be automatically adjusted based on the amplitude of the signal. Across embodiments, different gain masks may be arbitrarily complex. For example, a gain mask may contain any number of different values.

By using different gains during different time quanta when sampling a signal, in various embodiments, the amplitudes of a subset of the sampled time quanta may effectively be attenuated with respect to other samples. This may be done before recording the amplitude of each time quantum in a digital format. The collection of these measurements in a digital format may comprise a digital signal. According to some embodiments, after being captured by the capture device, the digital signal may be processed to reconstruct a faithful representation of the original analog signal.

In some embodiments, such reconstruction may include normalizing the amplitudes of each sample with respect to the gains that had been applied to each. For example, if a gain of 0.5 were applied to every other time quantum and a gain of 1 were applied to the remaining time quanta, then in some embodiments, every other time quantum may be scaled by 2.

In some situations, the amplitude of one or more samples may be clipped due to insufficient dynamic range of the digital sampling representation used by the capture device. In some embodiments, the true values of the clipped samples may be estimated by interpolation using the amplitudes of the non-clipped samples. In some embodiments, such an interpolation process may include constructing and/or solving a constraint optimization problem. Such problems may be solved using linear programming. In one embodiment, such a constraint optimization problem may be constructed and/or solved by using sign information from the clipped samples and/or by imposing a sparsity assumption on the output signal during the reconstruction process.

Figure 1A:
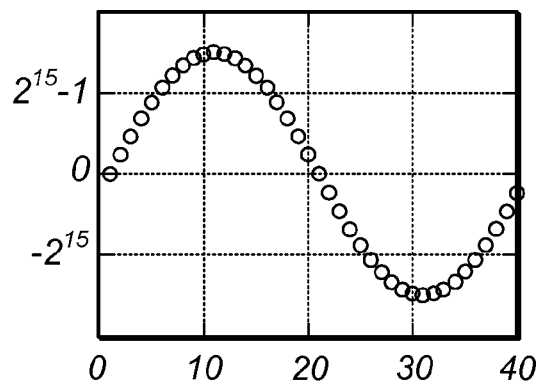
FIG. 1A is a graph plotting amplitude samples taken from a sinusoidal signal.

While the invention is described herein by way of example for several embodiments and illustrative drawings, those skilled in the art will recognize that the invention is not limited to the embodiments or drawings described. It should be understood that the drawings and detailed description hereto are not intended to limit the invention to the particular form disclosed, but on the contrary, the invention is to cover all modifications, equivalents and alternatives falling within the spirit and scope of the present invention as defined by the appended claims. Any headings used herein are for organizational purposes only and are not meant to limit the scope of the description or the claims. As used herein, the word "may" is used in a permissive sense (i.e., meaning having the potential to) rather than the mandatory sense (i.e. meaning must).

Similarly, the words "include", "including", and "includes" mean including, but not limited to.

DETAILED DESCRIPTION OF EMBODIMENTS

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Some portions of the following detailed description are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and is generally, considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

When sampling a signal, two operations may normally be performed: the quantization of time and the quantization of amplitudes. Embodiments herein may relate to the quantization of amplitudes, i.e., the conversion of a discrete-time continuous valued input x[k] to a discrete and finite representation $x_q[k]$. In embodiments, input signals may be represented in a discrete manner using two's complement encoding. In such a scheme, the quantization may be defined as being a rounding operation into $2^b$ discrete values, where b is the number of bits used to represent the samples. Since this representation may represent numbers valued from $[-2^b-1, 2^{b-1}-1]$, x[k] may be normalized so that it falls between these two values. Therefore, a sample quantization operation may be defined as:

$$x_q[k] = Q(ax[k]) \quad (1)$$

where $$a = \frac{2^{b-1} - 1}{\max|x[k]|} \quad (2)$$

Q( ) may be a function that rounds its input to the nearest integer. If the normalizing factor a is known in advance, then x[k] may be digitized, ensuring that the entire range of x[k] is properly represented by $x_q[k]$. If, however, a is not known in advance or if it is overvalued, there may be a risk of clipping the signal. Clipping may occur when the right hand side of (1) exceeds the range [−2b−1, 2b−1−1]. In such a case, $x_q[k]$ may be assigned the nearest of these two extreme values to represent an input that exceeds them. The result of this phenomenon when sampling audio signals may result in the introduction of a harsh and unpleasant distortion, as well as loss of information. Alternatively a small normalizing factor may reduce the clipping but may increase the risk of under-utilizing the dynamic range that the available bit depth provides, and in the process introduce extra quantization noise in addition to amplifying the potential pickup of ambient noise sources.

Figure 1B:
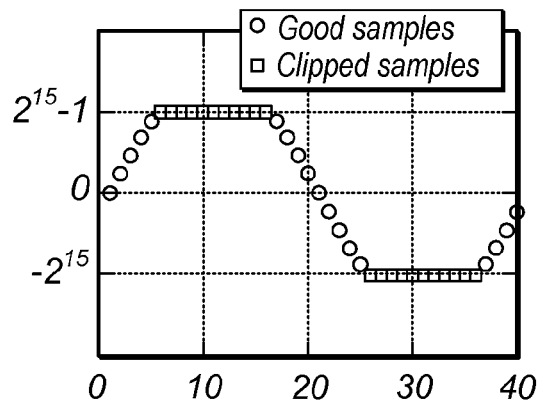
FIG. 1B is a graph of graph plotting amplitude samples taken from a sinusoidal signal, wherein some samples were clipped.

In various embodiments, a different approach to amplitude quantization may significantly offset the effects of signal clipping. Consider the example signal illustrated by FIG. 1A, which is a sinusoid that varies in value from −50000 to 50000. In various embodiments, the amplitude of the signal at each time quantum may be represented by any number of bits. For purposes of explication, assume that in a particular embodiment, 16 bits are used to represent each sample. The 16-bit samples may express a signal range from $-2^{15}$ to $2^{15}-1$, which is narrower than the signal's range. Therefore, as illustrated in FIG. 1B, when the signal is sampled and digitized, samples with amplitudes that surpass the maximum or minimum values expressible by the available sampling representation may be clipped, that is, set to the maximum or minimum value expressible by the sampling representation, depending on which is closer. In the illustrated case, the 16-bit sampling representation may lead to amplitudes outside of the maximum or minimum bounds to be clipped at $2^{15}-1$ and $-2^{15}$ respectively. As discussed above, such clipping can result in undesirable sound quality degradation.

By applying a gain to a signal, the signal may be amplified or attenuated according to the applied gain. In various embodiments, instead of applying a single (or no) gain value to the entire signal, a gain mask may be applied to the signal so that a different gain is applied to the signal at various time quanta. For example, in one embodiment, instead of applying no gain value to the signal at every time quantum (as in FIG. 1), a gain of 0.5 may be applied to every other time quantum. That is, before sampling an arbitrary input signal x[k], the following modulation may be imposed:

$$z[2k]=x[2k] \quad (3)$$

$$z[2k+1]=0.5x[2k+1]$$

This particular modulation, or gain mask, is used as an example only and is not intended to limit embodiments. In various embodiments, the scaling imposed on x[2k+1] need not be fixed to a factor of 0.5, but rather any value may be used that may appropriately express the expected uncertainty or fluctuation in the scaling of the input. In general, if all x[2k+1] values are divided by c, signals that vary by at most c times the dynamic range of the available bit depth may be reconstructed. Furthermore, the rate at which the gain of the input is modulated need not be one out of every two samples, but rather any number. The sampling technique described herein may therefore be generalized to use a sequence of normalizing factors comprising a gain mask, on consecutive chunks of samples. This can be expressed as:

$$z[k] = C\left[k - n\left\lfloor\frac{k}{n}\right\rfloor\right]x[k] \qquad (5)$$

where $\lfloor \ \rfloor$ denotes the floor operation and n is an integer denoting the length of the applied gain mask C[k]. In comparison, the approach of (3) shown above is a special case of this formulation where C[0]=1, C[1]=½, and n=2. In various embodiments, using this formulation may achieve better control of the tradeoffs between alleviating clipping and other artifacts that arise using the process described herein.

In other embodiments, the scaling factor may not be constant across time. Such embodiments may utilize sampling strategies similar to automatic gain control which may be characterized by:

$$z[2k] = x[2k] \qquad (6)$$

$$z[2k+1] = \frac{x[2k+1]}{c[k]}$$

where c[k] may be modulated by estimating the smoothed amplitude of x[k]. In such embodiments, when x[k] is within the dynamic range limits, c[k] may be set to 1, whereas when x[k] increases in magnitude a more appropriate c[k] may be chosen, for example, so that x[k]/c[k] lies within the available dynamic range. In such embodiments, the risk of corrupting the input signal when no clipping takes place may be mitigated. In such embodiments, the variable c[k] may be stored and used later in the reconstruction process as described below. Likewise, in some embodiments, the gain mask C[k] in (5) may be either fixed or adaptively varying.

In the embodiment described by (3), the new signal z[k] may be sampled to produce the quantized signal $z_q[k]$. To reconstruct the original signal x[k] from the gain masked signal $z_q[k]$, the modulation imposed by the gain mask may be undone by scaling the amplitude of each sampled point by an unscaling factor, such as the inverse proportion to the relative gain mask value applied to it. For example, if the above gain mask (3) were applied, then the quantized signal $\hat{x}[k]$ may be determined by applying the following conversion to $z_q[k]$.

$$\hat{x}[2k] = z_q[2k] \qquad (4)$$

$$\hat{x}[2k+1] = 2z_q[2k+1]$$

The process of undoing the modulation by scaling the amplitudes of one or more points may be referred to herein as normalizing the signal. The general purpose of normalization may be to estimate the amplitude of the original signal at each time quantum, had the same gain been applied to the signal at all time quanta. This may be achieved in various ways. For example, in embodiments such as the example shown above, normalization may comprise scaling each sample by the inverse of the gain that was applied to the signal during the corresponding time quantum. In other embodiments, the normalization need not always use the inverse, so long as the aggregate scaling of each point (calculated by multiplying the original gain by the unscaling factor) is equal for all samples.

Figure 1C:
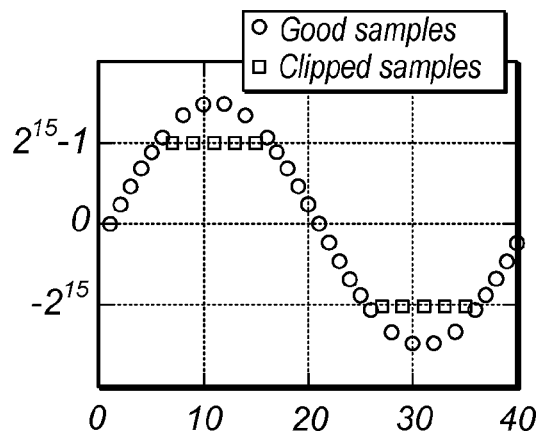
FIG. 1C is a graph plotting amplitude samples taken from a sinusoidal signal, wherein a gain mask was applied to the input signal and the digital signal was partially reconstructed, according to some embodiments.
Figure 1D:
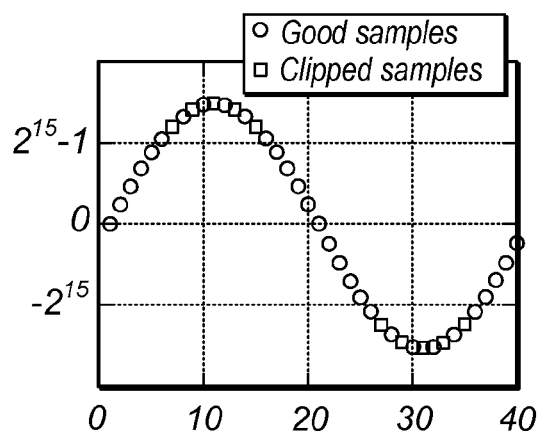
FIG. 1D is a graph plotting amplitude samples taken from a sinusoidal signal, wherein the samples were observed using a gain mask and reconstructed, according to one embodiment.

In embodiments, the reconstructed signal $\hat{x}[k]$ may be represented using a higher dynamic range than was available during the sampling. For example, instead of using a 16-bit sample representation, each sample may be represented using 32 bits. In another example, the amplitude of each sample may be represented using a floating-point format. FIG. 1C illustrates the quantized signal $\hat{x}[k]$ that may be produced when the above technique is applied to the signal of FIG. 1A. As illustrated in FIG. 1C, half of the large-magnitude samples, $\hat{x}[2k]$, have been clipped, while the other half $\hat{x}[2k+1]$, have not been clipped. The clipped samples may be identified as those that have assumed the extreme values of the 16-bit sampling representation. In various embodiments, different interpolation techniques or combination of techniques, may be used to reconstruct the values of the clipped samples of $\hat{x}[2k]$. Such interpolation techniques may rely on the available values of $\hat{x}[2k+1]$ and/or those of $\hat{x}[2k]$. By interpolating the clipped values, $\hat{x}[k]$ may be used as a reliable estimation of the original input signal x[k]. The result of performing such an interpolation is illustrated by FIG. 1D.

Figure 2:
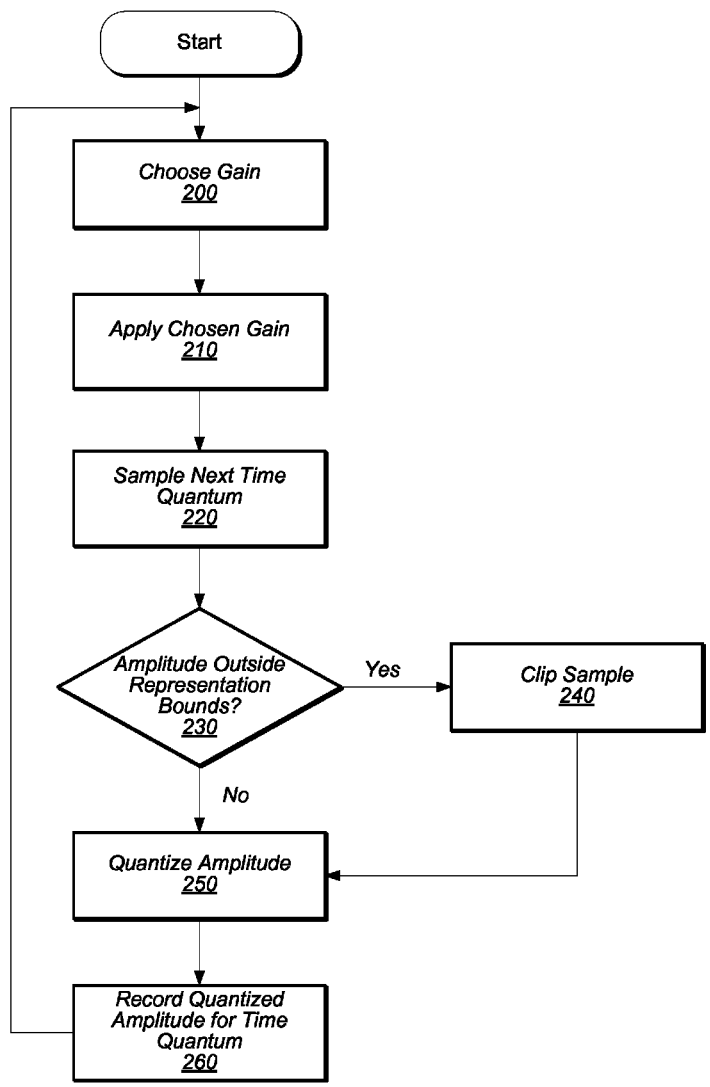
FIG. 2 is a flowchart illustrating a method for sampling an input analog signal, according to one embodiment.

FIG. 2 illustrates an example of a method for sampling an audio signal according to one embodiment. The illustrated method begins by choosing a gain value to apply to a signal during a given time quantum, as in 200. In some embodiments, the gain value may be predetermined by the gain mask, which may define a pattern of gain values applied to a series of time quanta. For example, as described above, a gain mask may halve the amplitude of every other sample. Once the gain for the next time quantum is chosen, the system may apply the chosen gain, as in 210. This may be accomplished using various techniques, such as by multiplexing the samples from two synchronized and offset ADC converters with different gains. In the illustrated embodiment, the next time quantum may then be sampled using the chosen gain, as in 220. If the amplitude is outside of the representation bounds, as in the affirmative exit from 230, then the sample's amplitude may be clipped. For example, if the representation format is 16-bits as in the example above, then the representation bounds may be a maximum of $2^{15}-1$ and a minimum of $-2^{15}$. Values outside of these bounds may be clipped by being set equal to the value of the nearest bound. Once the sample's amplitude is inside of the representation bounds, either without clipping as in the negative exit from 230 or after clipping as in 240, then the amplitude of the sample may be quantized as in 250. That is, a binary representation, such as the 16-bit representation discussed above, may be determined for representing the amplitude of the sampled time quantum. The quantized amplitude may then be recorded and associated with the time quantum from which it was produced, as in 260. As illustrated by FIG. 2, the method may be repeated for sampling the next time quantum, as indicated by the feedback loop from 260 to 200. A next gain may be chosen according to the gain mask and the process may be repeated.

Figure 3:
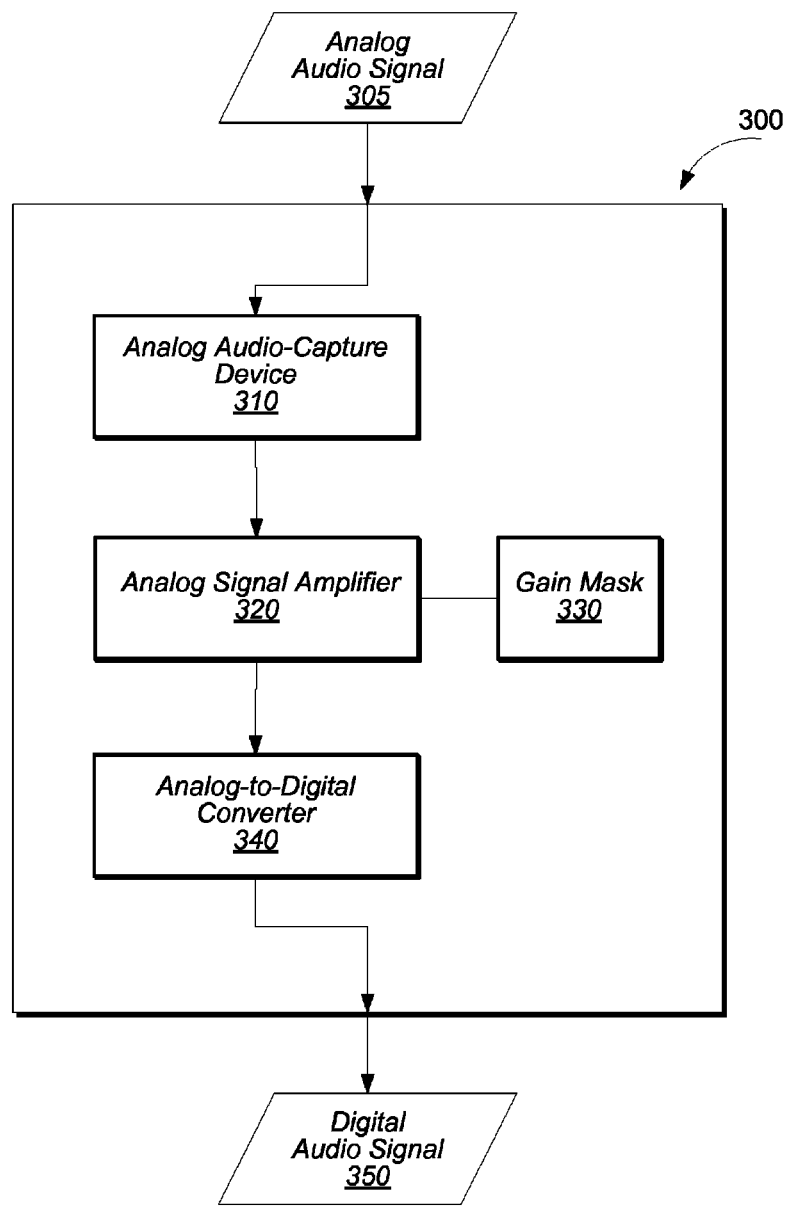
FIG. 3 is a block diagram illustrating a device capable of sampling an input analog signal as described herein, according to one embodiment.

FIG. 3 illustrates one embodiment of a system for sampling an input audio signal according to the disclosed sampling method. In some embodiments, device 300 may detect an input audio signal 305 using one or more analog audio-capture devices and/or components 310, such as one or more microphones. In some embodiments, an analog signal amplifier, such as 320, may process the captured audio. The analog signal amplifier 320 may have access to a gain mask, such as 330, and apply the gain mask to the analog signal by amplifying and/or attenuating the signal in each time quantum according to the gain mask values. As described above, those skilled in the art will appreciate that many methods may be used for applying a gain mask to the analog signal. For example, in one embodiment the samples may be multiplexed from two synchronized and offset analog-to-digital amplifiers with different input gains. Device 300 may also contain an analog-to-digital converter 340 for quantizing the samples. Analog-to-digital converter 340 may represent the amplitude of each sample in a digital format, such as a 16-bit value as described above. In some embodiments, converter 340 may be responsible for clipping the amplitude of samples that are outside of its digital representation capability. As illustrated, converter 340 may output a quantized, digital audio signal, such as 350.

Once digital signal 350 is produced, as by device 300, the signal may be processed to produce a digital signal that approximates the original analog signal 305. This may be referred to herein as signal "reconstruction". As described above, signal reconstruction may include normalizing the digital signal and then applying one or more interpolation techniques to reconstruct clipped samples.

In various embodiments, signal reconstruction may be performed by a component included as part of device 300. In other embodiments, digital signal 350 may be communicated to another device, such as a computer system capable of performing the signal reconstruction.

Figure 4:
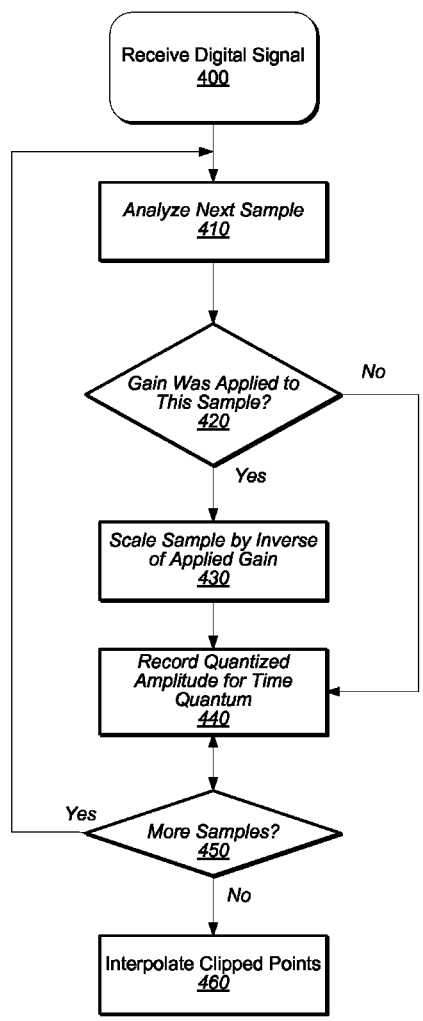
FIG. 4 is a flowchart illustrating a method for reconstructing a digital signal that was sampled as described herein, according to one embodiment.

FIG. 4 illustrates an example of a method for reconstructing a digital signal, such as signal 350 of FIG. 3, according to one embodiment. In phase 400 of the illustrated embodiment, a computer system or other mechanism capable of digital signal processing receives the digital signal output from an audio capture device (e.g., digital signal 350 from device 300 of FIG. 3). The system may then analyze each sample in the digital signal as illustrated by the workflow loop of 410-450. As in 410, a digital signal processing system may identify and analyze the next sample in the digital signal. The system may then determine if a gain was applied to the sample. In various embodiments, the digital processing system may become aware of the gain mask that was applied to the signal in different ways. In some embodiments, the system may simply assume that a certain gain mask was applied to the digital signal received in 400. In other systems, the gain mask that was applied to the signal may be communicated to the digital signal processing system. In some embodiments, the gain mask may be communicated along with the digital signal in 400.

According to the illustrated embodiment, if the system determines that a gain was applied to the sample, as in the affirmative exit from 420, the system may normalize the amplitude of the signal at the time quantum correlated to the sample. This may be done, for example, by scaling the sample by the inverse of the gain that was originally applied to it, as in 430. As discussed earlier, in other embodiments, an unscaling factor other than the inverse of the gain may be used. The system may then record the new, reconstructed, amplitude of the sample, as in 440. If the system determines that no gain was applied to a given sample, as indicated by the negative exit from 420, then the system may skip this normalizing step, as indicated by the negative exit from 420 to 440.

If more samples exist, then the digital signal processing system may repeat workflow loop 410-440 for each sample, as indicated by the affirmative exit from 450. According to the illustrated embodiment, once all samples have been processed and scaled back to their original values, as indicated by the negative exit from 450, the digital signal may be in a stage similar to that pictured in FIG. 1C. That is, the digital signal may still contain some samples that have been clipped.

The digital signal processing system may interpolate the values of any samples that were clipped, as in 460. In some embodiments, the amplitudes of the clipped samples may be interpolated using one or more prior art interpolation methods, such as cubic or piecewise spline interpolation. However, using generic interpolation techniques may allow aliasing artifacts to arise. For example, in the case of (3) where every other sample is clipped, it may be possible that the frequency of the sampled signal is sufficiently high that the unclipped samples are too sparse to provide a valid interpolation under generic assumptions. For example, if the sample rate of the unclipped samples is less than half the Nyquist rate, then the application of a simplistic interpolation technique may lead to a poor interpolation of the clipped values. In a case such as (3), because of the regularity of the missing information, it may be difficult to know if the available samples represent a frequency above or below half the Nyquist rate. If the sample rate were less than half the Nyquist rate, then a naïve interpolation could implicitly assume a bandlimited solution, which could result in "folding" the frequencies above half the Nyquist rate onto the lower half of the spectrum. This effect may be problematic since it may alter the spectral character of the input and introduce audible distortion.

In various embodiments, a digital signal processing system may largely recover from such aliasing effects by formulating and/or solving a constraint optimization problem for performing the interpolation. In one embodiment, a digital processing system may construct such a problem by using sign information from the clipped samples and/or imposing a sparsity assumption on the signals, during the reconstruction process.

As discussed earlier regarding some embodiments, during reconstruction, each sample with amplitude outside of the sampling range may be assigned the maximum or the minimum value of the digital representation according to its sign. Therefore, in some embodiments, the sign of a time quantum's amplitude may be determined based on the time quantum's clipped amplitude value. In some embodiments, this sign information may be used in the interpolation process.

Furthermore, frequency "folding", as may result from aliasing, may tend to produce a relatively busier spectral profile than that of an original signal. This may be due to the extra aliasing frequencies that sometimes appear on top of the original frequencies. In some embodiments, this information may be used in the interpolation process.

In one embodiment, a digital signal processing system may construct a linear programming problem that utilizes the sign information of clipped samples and/or the observation that folding tends to result in generally busier spectral profiles than those of the original signals. In one embodiment, a sparsity constraint may be imposed by $l_1$-norm minimization of the frequency coefficients of the reconstruction. Those skilled in the art will appreciate that the sparsity constraint may be defined using numerous other constructions. In one embodiment, the sparsity and sign constrain may be imposed together, for example, by the following linear program:

| 1. | minimize | $q^T f$ | | |
|---|---|---|---|---|
| 2. | subject to | $KF^{-1} f =$ | $K(\hat{a} \odot w)$ | (7) |
| 3. | | $\|UF-1f\| \geq$ | $\|U(\hat{a} \odot w)\|$ | |
| 4. | | $f_i \geq$ | 0 | |

In the example above, line 1 defines the minimum $l_1$-norm optimization in the frequency domain. In this example, the vector q may be a weight vector, and f may be a non-negative spectral representation of the audio signal. In some embodiments, the elements of q may all be set to 1. In other embodiments, the elements of q that correspond to high frequency coefficients of f may have slightly higher values. In such embodiments, this may be done to attain more sparsity in higher frequency ranges, thereby effectively imposing a slight preference towards a 1/f spectral structure, which may occur commonly in natural sounds.

The second line of the example program is an equality constraint, which ensures that the unclipped samples should maintain their values. The matrix K may be a diagonal matrix whose $i^{th}$ row diagonal element is equal to 1 if the $i^{th}$ element of the input sound is not clipped, and 0 otherwise. In the example, the matrix $F^{-1}$ may be an inverse spectral transform matrix that may transform the spectral coefficients of the non-negative vector f to the time domain. The vector â may be a short window of audio that is to be reconstructed. It may contain both re-normalized and clipped samples. For example, â may be the output from (4). In some embodiments where â is long, the vector may be broken up into several windows (i.e., a sliding window method) and the sound may be reconstructed one window at a time. The vector w may be a window function that helps suppress spurious spectral elements in f, so that the $l_1$-norm minimization focuses on actual peaks and not sidelobes that could appear due to poor frequency analysis. In this example, the operator $\odot$ signifies an element-wise (Hadamard) product, which may impose the windowing on the input signal.

The third line in the above linear program may impose the constraint that the clipped samples should have values that exceed in magnitude the numerical limits of the sampling representation. Here, U may be a diagonal matrix whose $i^{th}$ row diagonal element is 1 if the $i^{th}$ sample is clipped, and 0 otherwise (such that K+U=1).

Finally, the fourth line of the example linear program dictates that the spectral representation should be non-negative, which may ensure the $l_1$-norm minimization.

The example program constitutes a linear programming problem. Various prior art methods may be applied to solving such a linear programming problem. For example, if the digital signal processor is a computer, then any one of various freely available or commercially available linear programming solvers may be used (e.g., CLP, GLPK, lp_solve).

Linear program (7) is one example of a linear program for reducing aliasing effects in signal reconstruction and is not intended to limit embodiments to only this example formulation. The example is intended to illustrate that in one embodiment, aliasing effects may be reduced by finding a sparse spectral feature vector that, in the time domain, results in an output equal to the known samples and magnitude bounded from below by the clipped samples.

Figure 5:
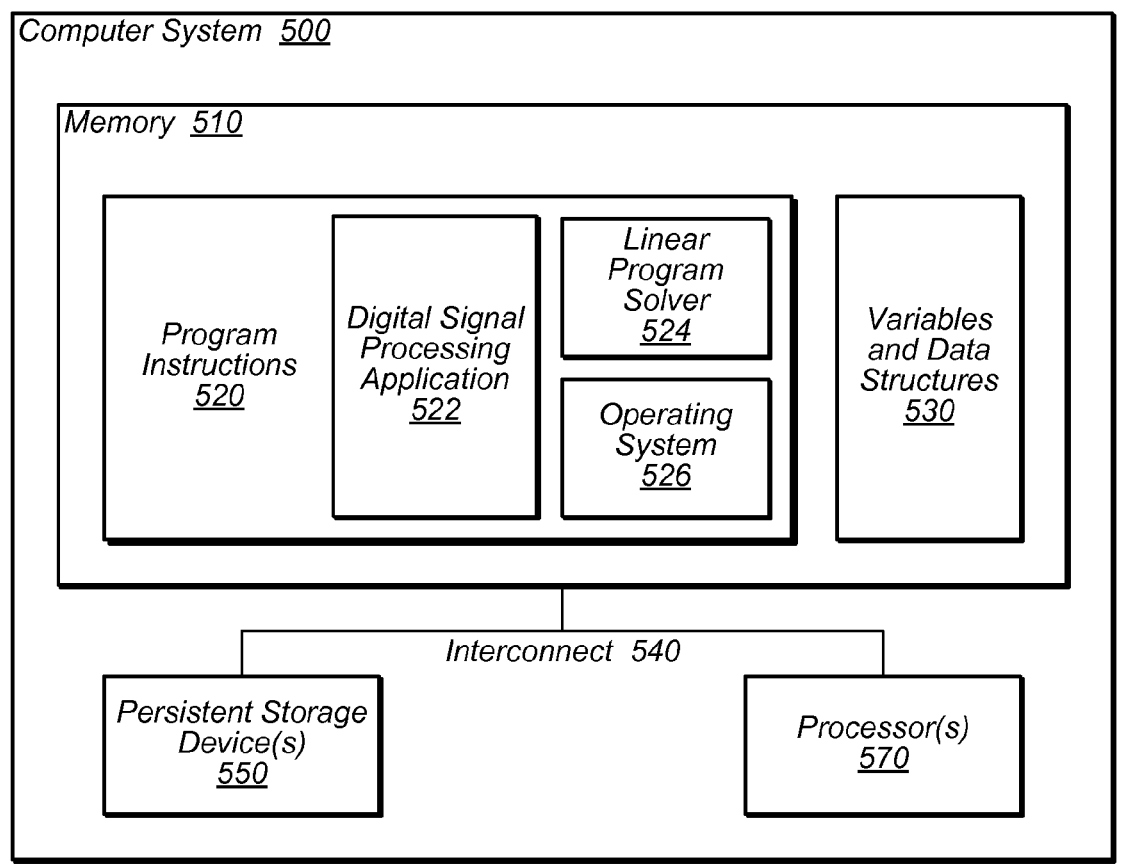
FIG. 5 is a block diagram of a computer system capable of reconstructing a digital signal that was sampled as described herein, according to one embodiment.

FIG. 5 illustrates a computer system configured to implement a digital signal-processing device, according to one embodiment, as described herein. The computer system 500 may be any of various types of devices, including, but not limited to, a personal computer system, desktop computer, laptop or notebook computer, mainframe computer system, handheld computer, workstation, network computer, a consumer device, application server, storage device, a peripheral device such as a switch, modem, router, etc, or in general any type of computing device.

The digital signal-processing mechanisms described herein may be provided as a computer program product, or software, that may include a computer-readable storage medium having stored thereon instructions, which may be used to program a computer system (or other electronic devices) to perform a process according to various embodiments. A computer-readable storage medium may include any mechanism for storing information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; electrical, or other types of medium suitable for storing program instructions. In addition, program instructions may be communicated using optical, acoustical or other form of propagated signal (e.g., carrier waves, infrared signals, digital signals, etc.)

A computer system 500 may include one or more processors 570, each of which may include multiple cores, any of which may be single or multi-threaded. The computer system 500 may also include one or more persistent storage devices 550 (e.g. optical storage, magnetic storage, hard drive, tape drive, solid state memory, etc) and one or more memories 510 (e.g., one or more of cache, SRAM, DRAM, RDRAM, EDO RAM, DDR 10 RAM, SDRAM, Rambus RAM, EEPROM, etc.). Various embodiments may include fewer or additional components not illustrated in FIG. 5 (e.g., video cards, audio cards, additional network interfaces, peripheral devices, a network interface such as an ATM interface, an Ethernet interface, a Frame Relay interface, etc.)

The one or more processors 570, the storage device(s) 550, and the system memory 510 may be coupled to the system interconnect 540. One or more of the system memories 510 may contain program instructions 520. Program instructions 520 may include program instructions executable to implement one or more operating systems 526, digital signal processing applications 522, and/or linear program solvers 524, as described herein. Program instructions 520 may be encoded in platform native binary, any interpreted language such as Java™ byte-code, or in any other language such as C/C++, Java™, etc or in any combination thereof.

In some embodiments, linear solver 524 may be implemented as a shared library and/or used by one or more digital signal processing applications 522. In other embodiments, linear program solver 524 may be implemented as a stand-alone application. Digital signal processing application 522 may comprise program instructions executable to perform signal reconstruction as illustrated in FIG. 4. In some embodiments, digital signal processing application 522 may be configured to set up a linear programming problem, as described herein, whose solution may interpolate the amplitudes of clipped samples. In some embodiments, digital signal processing application 522 may invoke linear solver 524 in order to solve such a linear programming problem. The digital signal processing functionality described herein may be spread across additional software components defined by program instructions 520 but not pictured in FIG. 5.

The system memory 510 may further comprise variables and data structures 530. Variables and data structures 530 may be used to store data used in digital signal processing, such as the signal itself and/or the gain mask that was used when sampling the signal, as described herein.

Various other modifications are possible to the method and system described herein. For example, a simple gain mask has been described above in order to make the presentation more accessible, but in some embodiments, more complex approaches may be possible. As described above, the size and composition of the gain masks may be of any length. In various embodiments, an appropriate gain mask may be determined and/or chosen dependent, for example, on the expected input signal.

When sampling, it may be desirable to ensure that the clipped samples within a mask are few. Therefore, the most cautious selection for a mask may be one where most of the gains are small, with only a few taking large values. Such a configuration may result in having to reconstruct fewer samples, thereby reducing the risk of introducing error during reconstruction. On the other hand, such a configuration may result in increasing the average quantization noise of the samples, since many inputs may be scaled down. An example of a more aggressive selection would be using many large gains and few small gains. This may result in having to reconstruct more missing data, but with little impact in the effective number of bits used to represent the samples.

In some embodiments, an appropriate gain mask in the spectrum may be chosen between these options. The decision may be based on knowledge regarding the kind of input signal expected. A highly kurtotic signal, like speech, may benefit from an aggressive choice of a gain mask, whereas a more uniform signal, like a popular music recording, may not benefit as much. In some embodiments, mask selection may be based on heuristic analysis of the input signal.

In some embodiments, the gain mask elements may be arranged in order to help the reconstruction process. For example, in some embodiments, a mask that results in smaller sections of contiguous clipped data may be used. For example, a gain mask of $[1,½,1,⅓]$ may be preferable to a gain mask of $[1,1,½,⅓]$ since the former gain mask may be less likely to result in long strings of clipped samples. Avoiding such strings of continuous clipped data may make the reconstruction process simpler and/or result in an aliasing pattern that is easier to resolve (the latter mask can result in "double" aliasing as opposed to the regular aliasing of the former mask).

In some embodiments, a completely random or pseudo-random gain mask may be used. In other embodiments, automatic gain control may be used to produce a gain mask. In embodiments where either of these approaches is implemented, the applied gain mask may be recorded by the sampling hardware and used by the digital signal-processing components during reconstruction.

In various embodiments, the sampling rate may be chosen in order to reduce aliasing effects. As described above, if a signal is oversampled by the length of the gain mask, there may be no serious aliasing risk. However, always choosing such a high sampling rate may not be practical. In some embodiments, oversampling by even a fractional amount, such as 10%, may reduce aliasing overlap and may lead to reconstruction with less error.

Different embodiments may be used in a variety of signal processing scenarios. For example, some embodiments may be used to reduce clipping effects in audio signals, such as voice recordings or musical recordings, as described herein. In various embodiments, different parameters may be used to calibrate the system or method according to the expected input. In other embodiments, the methods and/or systems described herein may be applied for reducing clipping in signals other than audio signals. For example, some embodiments may be applied to reduce clipping in video signals.

Although the embodiments above have been described in considerable detail, numerous variations and modifications will become apparent to those skilled in the art once the above disclosure is fully appreciated. For example, the analog audio capture device 300 of FIG. 3 may be integrated with the digital signal processing device of FIG. 5 and/or various functionality may be performed at different stages than is shown. Various functionalities may also be implemented in hardware rather than in software components as shown. It is intended that the following claims be interpreted to embrace all such variations and modifications.

What is claimed is:

1. A device-implemented method comprising:
receiving, from an analog capture device, a continuous analog signal;
sampling the continuous analog signal over a series of time quanta to provide samples of the continuous analog signal, each of the samples of the continuous analog signal corresponding to a respective one of the series of time quanta;
applying, via a gain mask, one of at least three gain values of the gain mask to each sample of the continuous analog signal; the one of at least three gain values applied to a respective one of the samples of the continuous analog signal based on the respective time quanta with which the one of the samples of the continuous analog signal corresponds; and
quantizing the gain-adjusted samples of the continuous analog signal as a discrete time digital signal that represents the continuous analog signal.

2. The device-implemented method of claim 1, wherein the at least three gain values of the gain mask comprise a sequential pattern of gain values and applying the at least three gain values comprises cyclically applying the sequential pattern of gain values to the samples of the continuous analog signal.

3. The device-implemented method of claim 1, further comprising, responsive to a magnitude of the continuous analog signal exceeding a digital range over which the gain-adjusted samples are quantized, reducing one of the at least three gain values of the gain mask.

4. The device-implemented method of claim 1, further comprising storing the discrete time digital signal to a computer-readable storage device or transmitting the discrete time digital signal to another device.

5. The device-implemented method of claim 4, further comprising storing an indication of the gain mask to the computer-readable storage device or transmitting the indication of the gain mask to the other device.

6. The device-implemented method of claim 1, wherein one of the at least three gain values is 1.0 and two other gain values of the at least three gain values are less than 1.0, the two other gain values being effective to attenuate respective samples of the continuous analog signal.

7. The device-implemented method of claim 6, wherein applying the at least three gain values of the gain mask to the samples of the continuous analog signal comprises applying the two other gain values to non-consecutive samples of the continuous analog signal.

8. The device-implemented method of claim 1, wherein the continuous analog signal comprises an audio signal.

9. One or more non-transitory computer-readable storage devices, comprising processor-executable instructions that, responsive to execution by a processor, implement a dynamic range extender to:
receive, from an analog capture device, a continuous analog signal;
sample the continuous analog signal over a series of time quanta to provide samples of the continuous analog signal, each of the samples of the continuous analog signal corresponding to a respective one of the series of time quanta;
apply, via a gain mask, one of at least three gain values of the gain mask to each sample of the continuous analog signal; the one of at least three gain values applied to a respective one of the samples of the continuous analog signal based on the respective time quanta with which the one of the samples of the continuous analog signal corresponds; and quantize the gain-adjusted samples of the continuous analog signal as a discrete time digital signal that represents the continuous analog signal.

10. The one or more non-transitory computer-readable storage devices of claim 9, wherein the at least three values of the gain mask are random or pseudo-random.

11. The one or more non-transitory computer-readable storage devices of claim 9, comprising additional processor-executable instructions that, responsive to execution by the processor, implement the dynamic range extender to record the random or pseudo-random gain values applied to the samples of the continuous analog signal, the recorded random or pseudo-random gain values order useful to reconstruct the continuous analog signal from the discrete time digital signal.

12. The one or more non-transitory computer-readable storage devices of claim 9, wherein one of the at least three gain values is 1.0 and two other gain values of the at least three gain values are less than 1.0, the two other gain values being effective to attenuate respective samples of the continuous analog signal.

13. The one or more non-transitory computer-readable storage devices of claim 9, comprising additional processor-executable instructions that, responsive to execution by the processor, implement the dynamic range extender to clip an amplitude of one of the gain-adjusted samples in response to the amplitude of the gain-adjusted sample being greater than a maximum quantizing value or less than a minimum quantizing value.

14. The one or more non-transitory computer-readable storage devices of claim 13, wherein to clip the amplitude of the gain-adjusted sample comprises quantizing the amplitude of the gain-adjusted sample using the maximum quantizing value or minimum quantizing value respectively.

15. The one or more non-transitory computer-readable storage devices of claim 13, wherein applying one of the at least three gain values to a respective one of the samples of the continuous analog signal is effective to prevent an amplitude of the respective sample from being clipped.

16. The one or more non-transitory computer-readable storage devices of claim 9, wherein the gain mask describes a sequential order in which to apply the at least three gain values to the samples of the continuous analog signal.

17. The one or more non-transitory computer-readable storage devices of claim 9, comprising additional processor-executable instructions that, responsive to execution by the processor, implement the dynamic range extender to select, based on a type of the continuous analog signal, the gain mask from a set of multiple gain masks.

18. The one or more non-transitory computer-readable storage devices of claim 17, wherein the type of the continuous analog signal comprises speech or music.

19. A system comprising:
an analog capture device configured to detect an analog signal;
a gain mask including at least three gain values useful to modify an amplitude of the analog signal;
an analog-to-digital converter configured to quantize the analog signal; and
a signal amplifier configured to:
receive, from the analog capture device, the analog signal;
apply, to the analog signal during each of a series of time quanta, one of the at least three gain values of the gain mask to the analog signal effective to amplify the analog signal by the applied gain value during each of the respective time quanta; and
transmit, to the analog-to-digital converter, the gain-adjusted analog signal for quantizing to provide a digital signal representing the analog signal, the analog-to-digital converter configured to quantize the analog signal at each of the respective time quanta.

20. The system of claim 19, wherein the at least three gain values of the gain mask comprise a sequential pattern of gain values and the signal amplifier is further configured to cyclically apply each gain value of the sequential pattern to the analog signal during one of the respective time quanta.

21. The system of claim 19, wherein two of the at least three gain values are attenuating gain values and the signal amplifier is further configured to apply the two attenuating gain values to the analog signal during non-consecutive time quanta.

22. The system of claim 19, wherein the analog-to-digital converter is further configured to clip the amplitude the gain-adjusted analog signal to a maximum digital range or a minimum digital range of the analog-to-digital converter.

23. The system of claim 22, wherein the signal amplifier is further configured to, responsive to the analog-to-digital converter clipping the amplitude of the gain-adjusted analog signal, modify at least one of the gain values of the gain mask.

24. The system of claim 19, wherein the at least three gain values of the gain mask are random or pseudo-random.

25. The system of claim 24, further comprising a gain recording module configured to record the random or pseudo-random gain values applied to the analog signal at each respective time quanta, the recoded random or pseudo-random gain values useful to reconstruct the analog signal from the digital signal.

26. The system of claim 19, wherein the digital-to-analog converter is further configured to output the digital signal to a computer-readable storage device or transmit the digital signal to another device.

27. The system of claim 19, wherein the analog signal comprises an audio signal.

28. A device-implemented method comprising:
receiving, from an analog capture device, an analog signal;
applying, to the analog signal during each of a series of time quanta, one of the at least three different gain values of a gain mask to provide a gain-adjusted analog signal that is attenuated or amplified during each of the respective time quanta according to the applied gain value; and
transmitting, to an analog-to-digital converter, the gain-adjusted analog signal for quantizing to provide a digital signal representing the analog signal over the series of time quanta, the analog-to-digital converter configured to quantize the gain-adjusted analog signal at each of the respective time quanta.

29. An analog signal sampling device configured to:
capture, via an audio capture component, an analog signal;
select, from a gain mask comprising a pattern of at least three different gain values, one of the three different gain values with which to amplify the analog signal;
apply, during one of a series of time quanta, the selected gain value to the analog signal to provide a gain-adjusted analog signal during the respective time quanta; and
quantize, at the respective time quanta, the gain-adjusted analog signal to provide a digitized representation of an amplitude of the analog signal for the respective time quanta.

30. One or more non-transitory computer-readable storage devices, comprising processor-executable instructions that, responsive to execution by a processor, implement a signal processing module to:
receive, from an audio capture device, an analog signal;

select, from a gain mask comprising a pattern of gain values, at least three gain values with which to amplify the analog signal;

apply, during at least three consecutive time quanta of a series of time quanta, the at least three selected gain values to the analog signal respectively to provide at least three respective gain-adjusted samples of the analog signal; and quantize, during the at least three consecutive time quanta, the at least three respective gain-adjusted samples of the analog signal to provide a digitized representation of the analog signal for the at least three consecutive time quanta.

* * * * *